United States Patent
Rodgers

(12) United States Patent (10) Patent No.: US 6,649,208 B2
Rodgers (45) Date of Patent: Nov. 18, 2003

(54) APPARATUS AND METHOD FOR THIN FILM DEPOSITION ONTO SUBSTRATES

(76) Inventor: Wayne E. Rodgers, 13448 Anoka La., Apple Valley, CA (US) 92308

( * ) Notice: Subject to any disclaimer, the term of this patent is extended or adjusted under 35 U.S.C. 154(b) by 29 days.

(21) Appl. No.: 10/124,039

(22) Filed: Apr. 16, 2002

(65) Prior Publication Data

US 2002/0176097 A1 Nov. 28, 2002

Related U.S. Application Data

(60) Provisional application No. 60/284,400, filed on Apr. 17, 2001.

(51) Int. Cl.[7] .......................... C23C 14/52; G01B 11/00
(52) U.S. Cl. ...................... 427/10; 427/255.5; 118/708; 118/712; 118/726; 118/730; 204/298.03; 204/298.27; 356/630; 356/632
(58) Field of Search ................. 118/708, 712, 118/726, 730; 427/10, 255.5; 204/298.03, 298.27; 356/630, 632

(56) References Cited

U.S. PATENT DOCUMENTS

| | | | |
|---|---|---|---|
| 4,582,431 A | | 4/1986 | Cole |
| 4,858,556 A | * | 8/1989 | Siebert ........................ 118/664 |
| 5,414,506 A | * | 5/1995 | Saisho et al. ................ 356/128 |
| 5,745,240 A | * | 4/1998 | Frakso et al. ................ 356/632 |
| 6,039,806 A | | 3/2000 | Zhou et al. |
| 6,338,775 B1 | * | 1/2002 | Chen ..................... 204/192.11 |

* cited by examiner

*Primary Examiner*—Richard Bueker
(74) *Attorney, Agent, or Firm*—Gabor L. Szekeres

(57) ABSTRACT

An apparatus for depositing thin films on a plurality of substrates has a vacuum chamber, a source of the material or materials to be deposited as the thin film, a source of energy for causing the material to be vaporized, and mechanical apparatus for imparting super-planetary and planetary motion to each substrate while the substrate is exposed to the vapors of the material. When a predetermined thickness of the film on any given substrate is reached the super-planetary motion is halted and only planetary motion and spinning are continued for the given substrate. During this process the thickness of the film being deposited is monitored accurately by an optical instrument having a linear axis of measurement which coincides with the center of the orbiting planetary motion of the substrate and is on the substrate itself.

20 Claims, 8 Drawing Sheets

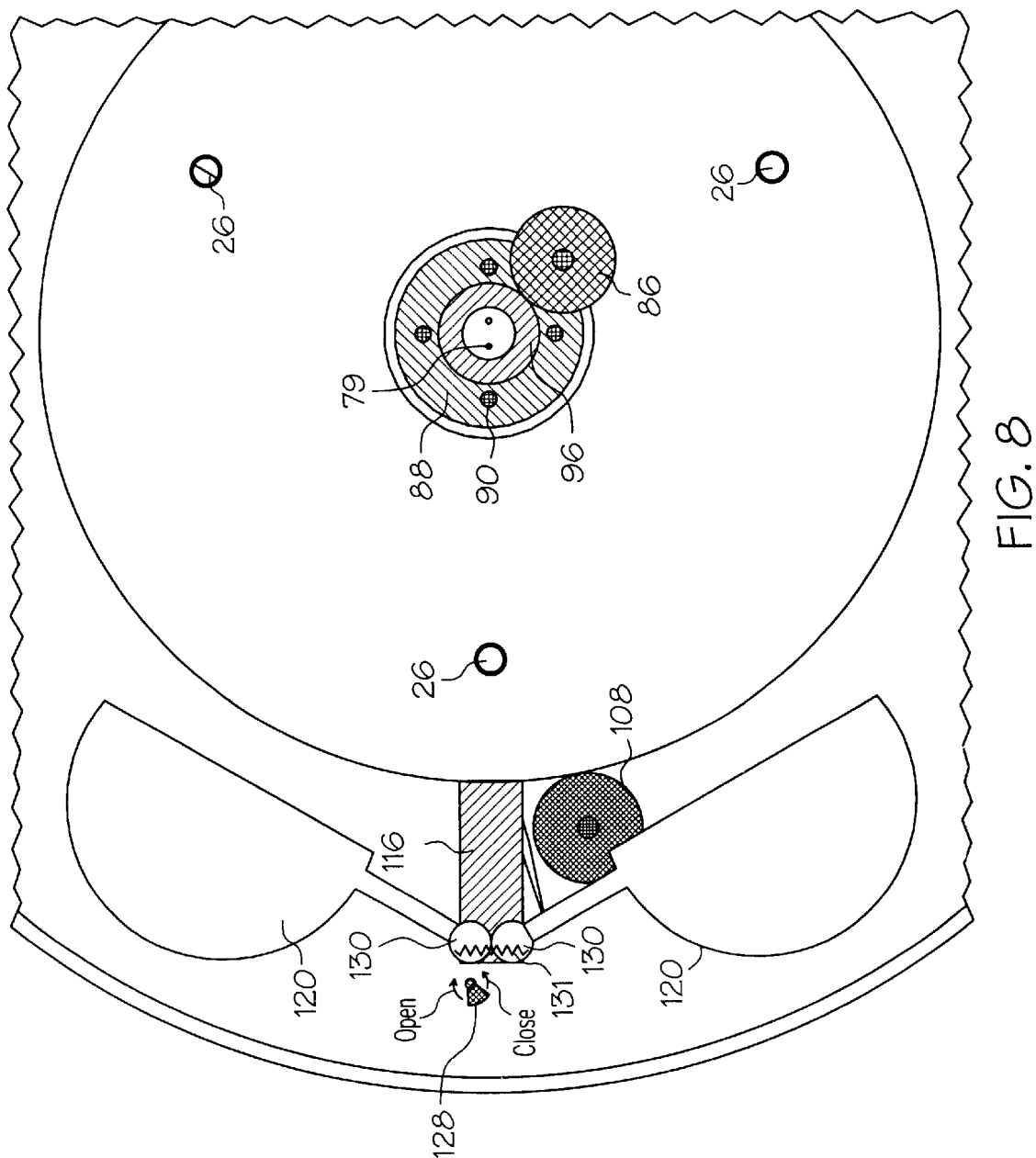

US 6,649,208 B2

APPARATUS AND METHOD FOR THIN FILM DEPOSITION ONTO SUBSTRATES

This application claims the benefit of application No. 60/284,400 filed on Apr. 17, 2001.

BACKGROUND OF THE INVENTION

1. Field of the Invention

The present invention is in the field of apparatus and method for depositing thin films onto substrates. More particularly, the present invention pertains to improved apparatus and method for depositing one or several thin film layers of precisely controlled thickness on one or more substrates. Still more particularly, the present invention pertains to the above-noted apparatus and method wherein the thickness of the thin film being deposited on one or more substrates is continuously monitored enabling precise control of the thickness of the film.

2. Background Art

Many optical elements have thin films coated onto them to increase their performance. Eyeglasses, windows, and camera lenses are typical of devices treated in this way. Semiconductors and medical devices are also frequently coated with optical thin films to obtain desirable surface properties. The substances which are typically deposited as thin films include but are not limited to titanium dioxide ($TiO_2$), silicon dioxide ($SiO_2$) and magnesium fluoride ($MgF_2$).

Optical thin films work by interference effects which occur when a phase difference is introduced between two light waves as they are reflected at the film's boundaries. To produce these effects the thickness of the film is usually a fraction of the wavelength of the light, but can be up to an order of magnitude thicker.

As is known in the art numerous performance enhancements are attainable through coating with optical thin films. They include increased or reduced light reflection, wavelength selection, wavelength splitting, mechanical protection, increased or reduced electrical conductivity, deposition of geometrical patterns, increase or decrease of surface tension, adhesion promotion or prevention, hermetic sealing of the surface, and others. Depending on the purpose and function of the deposited film or films, a single thin film or multiple layers up to the order of magnitude of $10^2$ may be deposited on a substrate.

A number of different methods are employed in the art to produce optical thin films. These can be, generally speaking divided into two main categories, physical and chemical vapor deposition. Among the commonly used methods of physical vapor deposition are sputtering (attained by application of D.C. voltage, radio frequency, or in a magnetron) and evaporation (attained by resistance, electron beam, or radio frequency heating). Chemical vapor deposition commonly uses methods such as thermal decomposition, or reaction caused by plasma or active gas bleed in. Combinations of the above methods are also frequently used in the art to maximize performance and/or reduce costs. Perhaps the presently most commonly used methods for depositing optical thin films are evaporation by heating with electron beam and magnetron sputtering.

In order to attain a film deposit of the desired thickness the deposition process is usually monitored and controlled by a combination of instrumentation and devices, such as ion vacuum gauges, substrate temperature monitors, crystal thickness monitors, optical thickness monitors, uniformity masks, planetary motion controllers, electron beam vaporization controllers and others instruments and devices known in the art.

Deposition of the thin film or films is conducted in a vacuum chamber which is evacuated so that the internal pressure is in the order of magnitude of $10^{-6}$ torr. At the low pressure prevailing in the vacuum chamber during its operation the mean free path of a particle (atom or molecule) is comparable to the distance between the source of the material to be deposited and the substrate, so that any particle moving in the direction of the substrate is likely to collide with it and be deposited thereon.

Generally speaking the state-of-the-art precision thin film coating systems fall into two categories. In one type of state-of-the-art systems the substrate is spun and also made to undergo a planetary motion (orbiting). The purpose of the planetary motion is to improve uniformity of thickness distribution of the film or films on the substrate. Because even planetary motion does not necessarily ascertain uniform thickness distribution of the film on the substrate, an also orbiting and spinning uniformity mask is also employed in the prior art to improve uniformity. As is known in the art, the shape of the uniformity mask determines its effect on the distribution of the deposited film on the substrate. In the devices employing planetary motion the thickness of the film being deposited cannot be measured directly, and therefore typically a witness sample or samples (witness chips) are placed in the center of the system. The thickness of the film being deposited on the non-orbiting witness sample can be continuously monitored by state-of-the-art instrumentation, however this measured parameter is not exactly identical with those of the film deposited on the orbiting substrate. A few prior art systems (such as the ones described in U.S. Pat. No. 4,582,431) utilize moving instruments to track a fixed location on a substrate undergoing planetary motion, but the motion of the instruments introduces additional sources of error in the precision of the deposited thin film or films.

In another type of state-of-the-art devices, the substrate spins in the vacuum chamber but does not undergo planetary motion while the optical film is deposited. In these devices the thickness of the film can be directly measured and monitored by instrumentation. Lacking the planetary motion however, the optical film is deposited less than ideally uniformly over the surface of the substrate.

Presently the most demanding performance requirements are those for Dense Wavelength Division Multiplexing Optical Elements. Manufacturing these elements requires extremely precise control of the coating process. Current coating systems are taxed to their limits when trying to create the extremely narrow bandpass optical filters needed for this type of application where band-widths of 0.8 nm, or less are typical. This usually requires control of the thickness of the deposited film with a precision approaching of 0.001 percent, or better. Typically, the deposition of 100 or more coating layers with little or no measurable deviation from their desired thickness is necessary to produce a single product. In order to reach this accuracy the use of witness sample, planetary motion, and uniformity mask is normally sacrificed in the present state-of-the-art in favor of a single optical monitor coupled to a single rotating substrate. Due to the lack of planetary motion however, this results in less than desirably uniform distribution of the films on the surface of the substrate. Yields of usable product are often quite low because many coated substrates are unusable altogether. Those that are useable generally produce only a narrow radial band of acceptable elements from within the much larger substrate.

U.S. Pat. No. 6,039,806 (Zhou et al.) discloses a precision optical coating system of this second type having a plurality of "stations" in a vacuum chamber where the substrate is rotated but not orbited at each of the stations and where the deposition of the optical coating material is monitored in situ. However, even in the device of this reference the lack of planetary motion is likely to result in less then desirably uniform distribution of the coating material on the surface of the substrate.

It is also known in the art to use shutters in optical coating systems where more than one substrate is subjected to deposition of coating material. In these systems after a desired film thickness is attained on a substrate a shutter corresponding to that substrate is deployed to shield the substrate from further film deposition, while deposition of coating material on one or more substrates in the vacuum chamber is still continued. Such a shutter system is described for example in U.S. Pat. No. 6,039,806. To the best knowledge of the present inventor planetary shutters, other than shutters to cover the source, have not been used in the prior art in optical thin film depositing systems employing planetary motion.

In light of the foregoing, it is readily apparent that there is need for improvement in the state-of-the-art. There is a need to reduce the cost of manufacturing precision coated optical elements such as Rugate filters, narrow bandpass filters, dichroic filters, beam-splitters, and the like. It is also desirable to reduce the cost of manufacturing precision coated non-optical elements such as semiconductors, medical devices, sensors, and the like.

SUMMARY OF THE INVENTION

The present invention provides, for the first time known to the inventor, an optical coating system wherein optical coating material is deposited on one or more substrates where the substrate spins, undergoes planetary motion and is subjected to the uniformity enhancing effect of a corresponding uniformity mask while the thickness of the coating material can nevertheless be monitored on the substrate itself during the progress of the deposition. In one embodiment of the invention only one substrate is thin-film deposited in this manner. In a more sophisticated embodiment of the invention which employs super-planetary and sub-planetary motions a plurality of substrates are thin film-coated in the vacuum chamber while the deposited film on the substrate is monitored by appropriate instrumentation in situ. In this embodiment shutters are utilized to shield each substrate from further deposit of coating material after it has been determined that the desired thickness of film had been attained on the respective substrate.

The foregoing and other hereinafter disclosed features and advantages are attained in a device or system having a vacuum chamber, a source of the material or materials to be deposited as thin film, means for causing the material or materials to be deposited on a substrate surface, electromechanical or mechanical means for spinning and causing orbiting planetary motion to at least one substrate wherein the center of the orbiting planetary motion of the substrate is on the substrate itself, and instrumentation means for monitoring the thickness of the film of the material being deposited on the substrate itself.

BRIEF DESCRIPTION OF THE DRAWINGS

FIG. 8 is an enlarged schematic representation in a top view of a super-planetary system having three sub-planetary stations, in accordance with the other embodiment of the present invention, the view showing a detail of a shutter system utilized in this embodiment.

GENERAL DESCRIPTION OF THE INVENTION AND ITS ADVANTAGES

Figure 1:
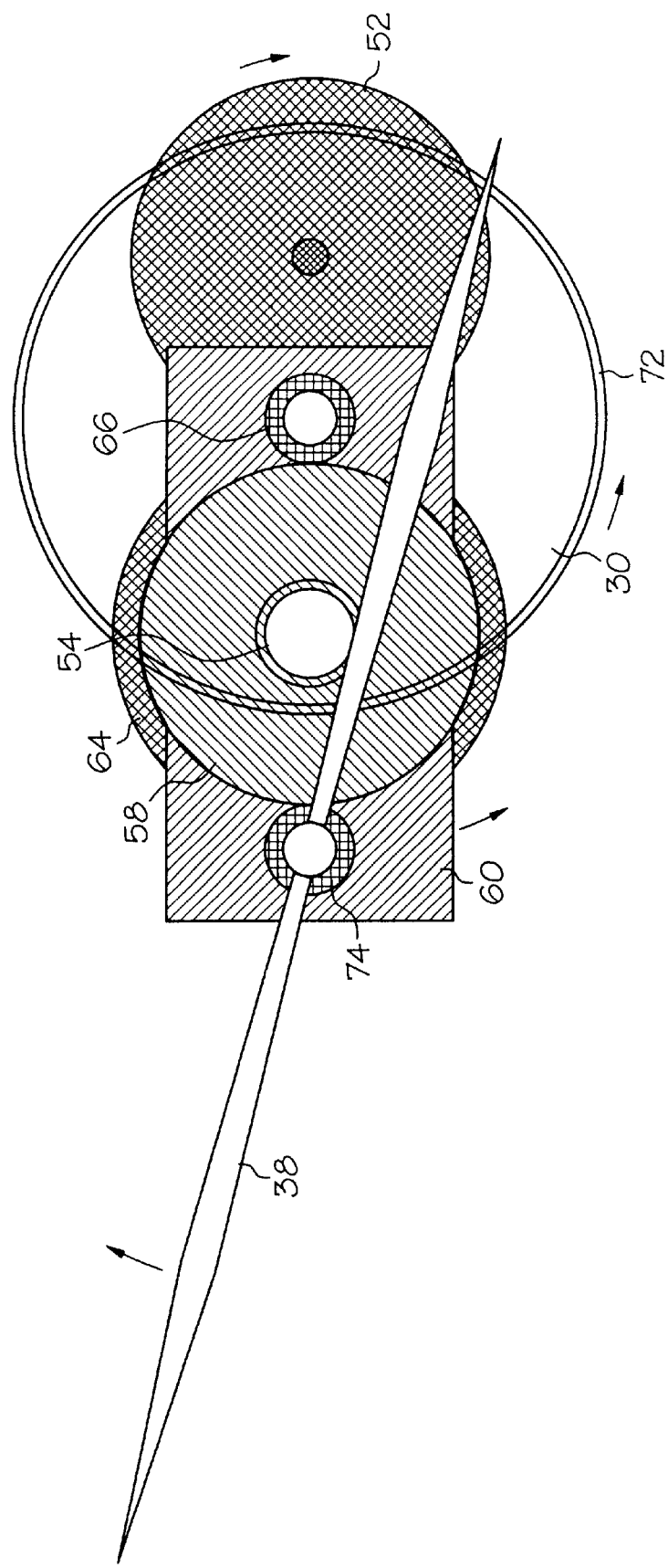
FIG. 1 is a schematic representation in bottom view of a single planetary system and uniformity mask in accordance with the present invention.

A primary novel feature of the present invention is that in a system or device designed for depositing optical thin film layers on a substrate and of the type which imparts spinning and orbiting planetary motion to the substrate on which the thin film layer or layers are deposited, the center of orbiting planetary motion is on the substrate itself. Appropriate electromechanical or mechanical equipment or gearing is provided to cause this type of complex spinning and orbiting planetary motion, as well as spinning and orbiting planetary motion for a uniformity mask that can be used to improve the uniformity of the thin film or layer deposited on the substrate.

The foregoing arrangement of components and motions allow monitoring the dimensions of the deposited film on the substrate itself, while the film or layer is being deposited, and thereby allows uniformity and the type of precision required in the most demanding applications, such as the fabrication of Dense Wavelength Division Multiplexing Optical Elements, where the typical thickness of a layer must be controlled with a precision approaching 0.001 percent (and desirably even better) and where one hundred or more of such layers are typically deposited in succession on the same substrate. As is noted in the introductory section, many kinds of materials can be and are usually deposited as thin films in the state-of-the-art (such as $TiO_2$ and $SiO_2$) and the present invention is not limited by the material or materials which are deposited as thin films. Nor is the present invention limited by the type of substrate on which thin film or films are deposited, nor by the purpose or use of the element fabricated through the use of the present invention. Nevertheless, as is noted above, due to its greatly improved precision and uniformity the present invention is uniquely suited for the fabrication of such elements where the highest level of accuracy and uniformity are required.

Several elements or components of the novel system of the present invention can be constructed in accordance with the state of the art, or by such modifications of the state of the art which will become readily apparent to those skilled in the art in light of the present disclosure. For example, the vacuum chamber in which the novel components or aspects of the present invention are placed can be constructed in accordance with the state of the art, and is not described here in detail beyond stating that it is typically of cylindrical construction having a diameter of 3 to 4 feet. However, the invention is not limited by the size of the vacuum chamber nor by the sizes of other components which are employed. The equipment or device which holds the source material or materials and the means for causing the source material to "evaporate" for eventual deposit on the substrate can also be constructed in accordance with state of the art and do not limit the present invention. More than one type of means for causing the source material to evaporate may be used. Nor is the invention limited by the manner, method or means for heating the substrate, nor by the means for evacuating the vacuum chamber to attain the desired level of vacuum (of the $10^{-6}$ torr magnitude), all of which can be constructed in accordance with the state of the art or by such modifications thereof which will be readily apparent to those skilled in the art in light of the present disclosure.

As is known, in order to obtain a filter which allows only a narrow band of light to pass through, two layers of materials, each with a different refractive index (e.g. $TiO_2$ and $SiO_2$) are needed. In a typical application the thickness of each layer is ¼ of the wavelength, such that if the wavelength (λ) of the light is 1.6µ, then the thickness of each deposited layer should be 0.4µ. In the practice of the present invention, as in the state-of-the-art, it takes approximately 20 minutes to deposit a layer of such magnitude, so that it takes approximately 36 hours to deposit approximately 100 layers, as needed for example in the manufacture of a Dense Wavelength Division Multiplexing Optical Element. A typical substrate in the practice of the present invention, as in the state of the art, is a transparent member such as a lens or a glass plate of approximately 4 to 8 inches in diameter, however the present invention is not limited by the size or shape of the substrate.

Greater uniformity of the deposited layer on the surface of the substrate in accordance with this invention in comparison with the prior art results from the use of planetary motion and a rotating uniformity mask while still maintaining continuous monitoring. This is in contrast with prior art direct monitoring systems which perform continuous intensity-based monitoring at a fixed location on the part. Fixed position uniformity masks of the prior art do not perform as well as the orbiting and rotating ones of this invention. The lack of planetary motion in prior art systems also limits uniformity masking to one coating material source location.

As noted above, prior art planetary systems generally cannot use continuous monitoring of the substrate. The orbiting movement of the substrate precludes the use of a fixed optical monitoring system to directly measure the film being deposited on the substrate. Greater precision and accuracy in this invention as compared to the prior art, are the result of fixed optical path continuous monitoring of the coated substrate itself. In the preferred embodiments wavelength spectrum optical monitoring is used instead of the single wavelength intensity monitoring which is presently standard in the art. Wavelength spectrum monitoring is substantially insensitive to the interruptions caused by a rotating uniformity mask or by multiple-slit substrate holders. This is a result of measuring the spectral distribution of light as modified by the substrate instead of measuring the intensity at a single wavelength. Wavelength spectrum monitoring instruments are available commercially, for example from Jobin Yvon-Spex (Edison N.J.), McPherson Inc. Chelms, Mass. and others.

An improvement in the speed of production of high precision thin-film coated optical elements is attained in a more sophisticated embodiment of the invention where a super-planetary motion is superimposed over the planetary motions of several (usually 3) sub-planetary stations. These complex motions enable the use of multiple sources in the same vacuum chamber, with satisfactory results.

A still further optional feature of the present invention is the use of replaceable uniformity masks. This results in still further improvement in uniformity as compared to the prior art. In accordance with this optional feature at the conclusion of each coating run the substrates are subjected to a thorough inspection. Any non-uniformity measured in the coating which is deemed sufficiently significant is then taken into consideration to provide an improved uniformity mask design program, thus allowing the computation of a new mask configuration and the manufacture of an improved uniformity mask for a subsequent coating run. In this way the performance of the coating system can be continuously refined. Different sets of uniformity masks can also be produced and installed for specific coating protocols based on historical performance results.

As noted above, a greater production quantity per coating run can be obtained through the implementation of multiple sub-planetary stations on which a super-planetary motion is also imposed, as in the more sophisticated embodiment of the present invention. In this embodiment the number of substrates is multiplied by the number of sub-planetary stations installed. Presently it is preferred to install three (3) sub-planetary stations in this embodiment, although the invention is not limited by this number. It is in this embodiment where the use of wavelength spectrum monitoring attains special importance. This is because the prior art single-wavelength-intensity monitored systems require a history of thickness buildup to accurately compute the cut-off point of the coating. This type of monitoring generally precludes the ability to re-start monitoring of a substrate in mid-coating, as is required in a device having super-planetary motion superimposed on the motion of multiple sub-planetary-stations. This problem is solved by using wavelength spectrum monitoring which allows computation of an accurate cut-off point for the deposition of each layer, regardless of prior coating history.

Referring now to the drawings in a general sense, and still describing the generic features and advantages of the present invention, the device or system of the invention generally comprises a large vacuum chamber 20 containing at least one source 22 for the optical coating material vapors 24, and a planetary system or station 26 forming means for spinning, orbiting in planetary motion and holding a substrate 30. The means for holding the substrate 30 is a mechanical component or device which includes one or more gears and bearings to allow the required motions, and clamps, springs, screws and the like state-of-the-art mechanical components suited to removably affix the substrate 30 to the means, to hold the substrate 30 while the deposition of coating material(s) occurs, and thereafter to allow removal of the substrate 30 from the spinning orbiting and holding means. These means are of such construction that optical monitoring of the substrate 30 through an optical path is made possible. This can be accomplished by constructing the holding part of the means partially of glass or other transparent substance or by providing openings in the holding means to allow optical access to the substrate 30.

The term substrate 30 itself is used in a generic sense in the present description in that more than one actual physical piece or item (such as flat glass or lens or the like) may be held by the holding means, for example by several clamps, screws, springs or like devices, each device holding one item or piece. In this case the plurality of these pieces or items are to be considered the substrate 30. In such a case where the substrate 30 comprises a plurality of items, the guiding principle of the present invention still holds true in that the center of orbiting motion of the substrate 30 is on the substrate 30 itself. This is true in the sense that the plurality of items jointly comprise the substrate 30 and in that the continuous optical monitoring of the thickness of the deposited film then actually measures an average of the film's thickness deposited on the plurality of items that constitute the substrate 30.

The system or device of the invention also incorporates a shutter 32 for each source 22 (if there is more than one source), a crystal monitoring system or instrument 34, a wavelength spectrum optical monitoring system or instrument 36, and a replaceable rotating uniformity mask 38. As used hereinafter in the present description the term source 22 is intended to include not just the material or materials the vapors of which are deposited on the substrate or substrates 30, but also the means for causing the material to vaporize, that is the means for causing physical or chemical vapor deposition. As is described in the introductory section such means for causing physical or chemical vapor deposition are known in the art. The function of the crystal monitoring system or instrument 34 is to measure the rate at which the vaporized material is being deposited in the chamber and thereby provide an estimate of the thickness of the film actually deposited on the substrate. Such instruments are known and available in accordance with the state of the art, and can be obtained commercially for example from Inficon, Syracuse N.Y. As is known, the crystal monitoring instrument 34 is capable of monitoring the thickness of the deposited film independently of the motion of the substrate because the crystal monitoring instrument 34 is mounted stationarily in the vacuum chamber 20.

Where multiple sub-planetary stations 26 are implemented, the system or device comprises a large vacuum chamber 20 containing at least one source 22 of optical coating material vapors 24, and a super-planetary system 40 holding the multiple sub-planetary stations 26, each sub-planetary station 26 forming the means for spinning, orbiting in planetary motion and holding a substrate 30 (in the sense described above for the single planetary station 26). This more sophisticated device also incorporates shutters 32 for each source 22, separate shutters 120 for each sub-planetary station 26, a crystal monitoring instrument 34, and a wavelength spectrum optical monitoring instrument 36. Each sub-planetary system 26, like the single system of the first embodiment, also includes a replaceable rotating uniformity mask 38.

The super-planetary device 40 is equipped to both rotate at a controlled speed and to stop and hold a precise position with respect to the optical monitoring instrument 36. Each sub-planetary station 26 is offset from the other sub-planetary stations 26 by a distance in the axial direction from the source(s) 22 of the coating material vapors 24. The difference in these distances (offset) is sufficient to alter the relative rate of deposition of vapors on the substrate(s) 30 held in each sub-planetary station 26. As a result, the substrate 30 on each sub-planetary station 26 can be monitored independently and coated to obtain the desired final thickness of the deposited film. Each sub-planetary station 26 is equipped with a shutter 42 to halt the deposition of material onto each substrate 30, independently. The shutters 32 for each source can be used to prevent deposition during source stabilization and as otherwise required.

The planetary movement of the more sophisticated embodiment of the invention that has a super-planetary system 40 having multiple sub-planetary stations 26 is uniquely arranged such that each sub-planetary station 26 moves through most of the available coating material vapor deposition region; each substrate 30 moves in addition to the super-planetary motion in a sub-planetary motion as well while within the vapor deposition region; and each substrate 30 rotates about its own center within the sub-planetary; providing for exceptional consistency of coating. As the guiding principle of the invention the center of orbiting sub-planetary motion of each substrate 30 is within the substrate 30 itself (as the substrate 30 is defined and explained above). The rotating uniformity mask 38 of each sub-planetary station 26 further compensates for differential coating deposition rates across the surface of the substrate 30. As is known, these differential rates occur because the rate of deposition varies with the square of the distance to the coating vapor source 22. The substrate 30 is typically flat and therefore points on its surface vary in distance from the vapor source 30, resulting in non-uniform thickness of the deposited film, if this variation is not compensated by appropriate masking. The uniformity mask 38 is coplanar and in close proximity to the substrate 30 so that mask effects are substantially the same for each of the possible multiple sources 22 located at similar distances and angles of incidence to the substrate 30. Precession of the center of rotation of the uniformity mask 38 is synchronized with precession of the center of rotation of the substrate to obtain consistent masking. Preferably different rotation rates are used for the mask 38 and the substrate 30 to ensure that the mask effects are randomized.

In the more sophisticated embodiment of the invention that has a super-planetary system 40 having multiple sub-planetary stations 26 coating on all substrates 30 for each layer is performed and monitored with the crystal monitoring instrument 34 until approximately 90% of the desired thickness of the layer is reached. The super-planetary motion is then stopped with the most proximate substrate 30 to the source 22 being coated the thickest. The sub-planetary station 26 having this substrate 30 is caused to locate in a predetermined, set location in the vapor deposition region. The wavelength spectrum optical monitor instrument 36 is then used and coating for this substrate 30 is completed without super-planetary motion with the sub-planetary motion in process, and while the thickness of the layer being deposited is continuously measured by the instrument 36. During this time, the remaining substrates 30 are also coated, but not to completion since their rate of deposition is slower. The shutter 42 for the completed substrate 30 is closed and the next thickest coated sub-planetary station 26 is rotated into position where the substrate 30 is monitored with the instrument 36. This substrate 30 is coated to precise completion and the shutter 42 of the corresponding sub-planetary station 26 is closed. This cycle is repeated until all substrates 30 have been coated to completion for the given layer. Thereafter the vapor source 22 is prepared for depositing the next layer and full super-planetary motion is resumed. For this the shutters 42 of each sub-planetary station 26 are reopened to enable coating of the next layer on each substrate in each station 26. At 90% completion of this layer the super-planetary motion is stopped once again. These cycles are repeated until the desired number of layers have been deposited on all substrates 30.

Returning once again to the description of an important feature of the present invention, in the more sophisticated embodiment of the invention that has a super-planetary system 40 having multiple sub-planetary stations 26, after the super-planetary motion has been stopped and the desired sub-planetary station 26 is at the designated location, the substrate 30 held in the sub-planetary station 26 orbits in a planetary motion about a center or axis 43 that is slightly inside the outer edge of the substrate 30. This axis 43 is coincident with the longitudinal axis of the optical monitoring system. This arrangement permits continuous optical monitoring of the substrate 30 even while the sub-planetary station 26 orbits. This is in contrast with the prior art systems having planetary motion which consistently utilize centrally located witness sample that can be continuously monitored. These witness sample substrates seldom represent the actual coating on the target substrates. As a result they generally speaking do not provide satisfactory results for the most precise coatings.

In the embodiments of the present invention which have only one planetary station 26 and no super-planetary motion is imposed thereon, the rate of orbiting planetary motion is in the range of 50 to 1000 rpm, a more preferred range being 500 to 800 rpm. The range of spinning the substrate is between 100 to 3000 rpm, a more preferred range being 1000 to 1500 rpm.

In the embodiments of the invention where a super-planetary motion is imposed on multiple sub-planetary stations 26, the rate of orbiting super-planetary motion is in the range of 10 to 100 rpm, a more preferred range being 20 to 50 rpm. In these embodiments the rate of orbiting sub-planetary motion is in the range of 50 to 1000 rpm, a more preferred range being 500 to 800 rpm. The range of spinning the substrate is between 100 to 3000 rpm, a more preferred range being 1000 to 1500 rpm. However these ranges should not be considered limiting the invention because it is generally understood in the art that faster revolutions of the spinning and orbiting motions are desirable, and that practical limitation of these revolutions are primarily set by balancing the need for high rpms versus the need to attain practically acceptable useful lives for the bearings used in the device.

It will be readily recognized by those skilled in the art, especially in view of the subsequent detailed description of the gearing mechanism which in the preferred embodiments produces the above-described complex motions that the rates of these rotations can be controlled by the gearing mechanism. The entire system of a single planetary station 26 can be, and is preferably driven by a single motor, and the system of having several subplanetary stations 26 is preferably driven by two motors, one for driving all sub-planetary stations 26, and the other to superimpose a super-planetary motion.

DESCRIPTION OF THE PREFERRED EMBODIMENTS

Figure 2:
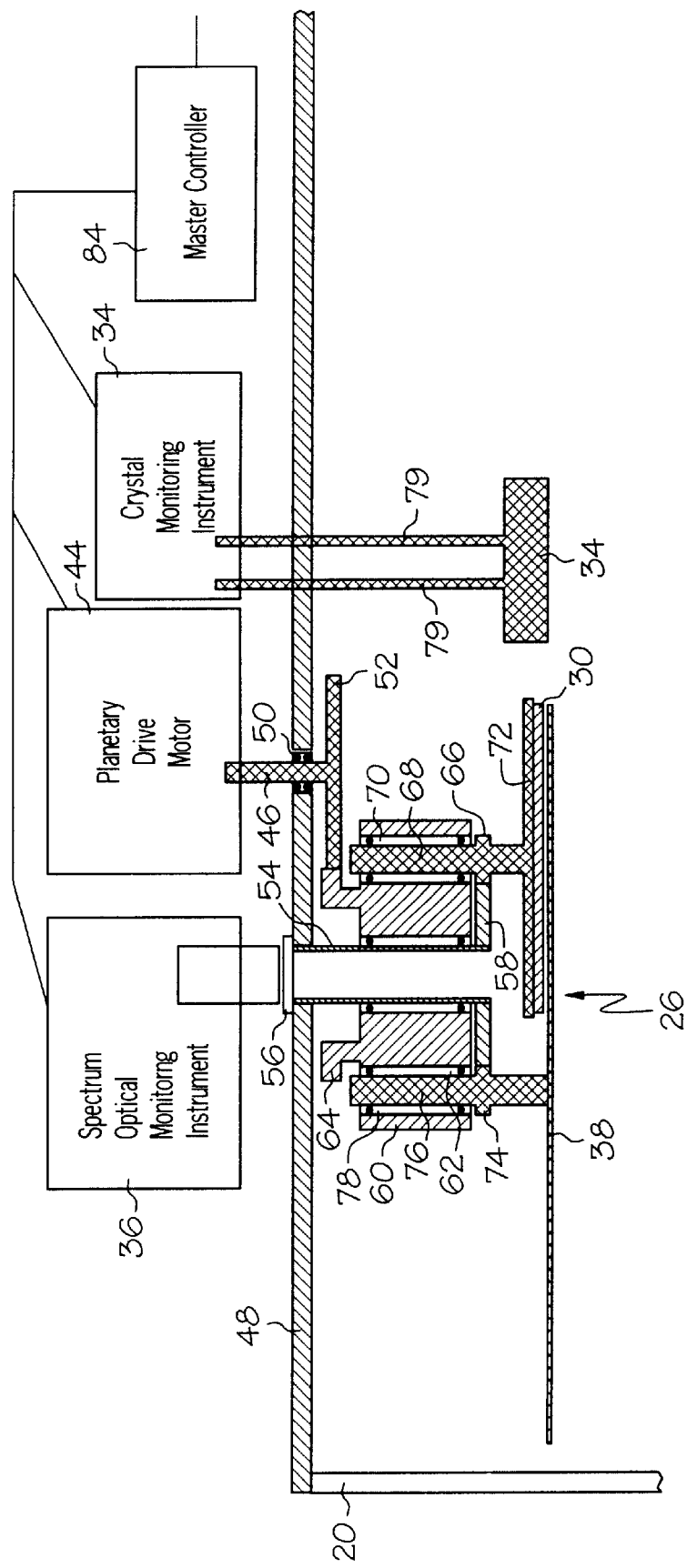
FIG. 2 is a schematic representation in cross-sectional view of a single planetary system in accordance with the present invention.
Figure 3:
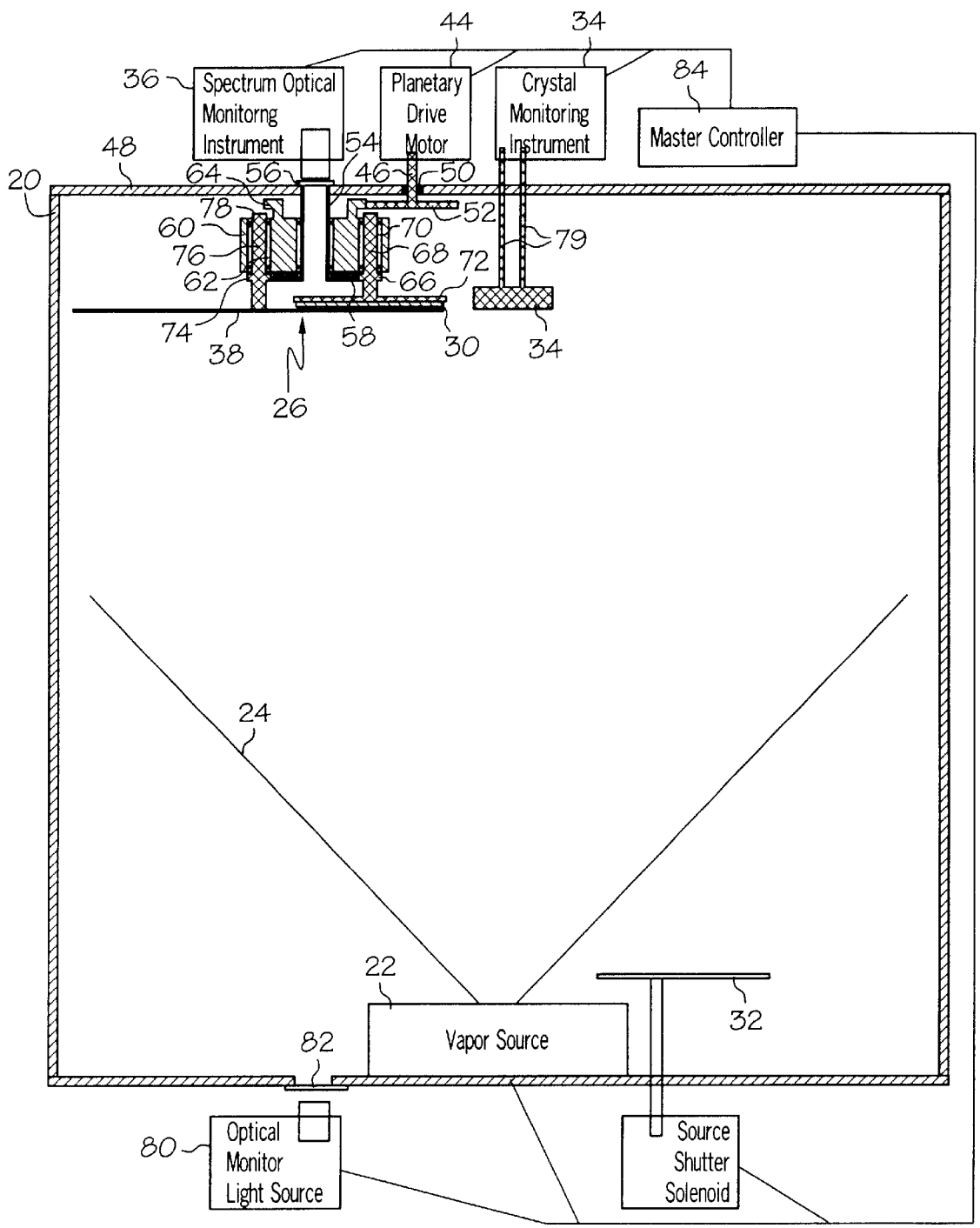
FIG. 3 is a schematic representation in cross-sectional view of a single planetary system and coating source in a vacuum chamber in accordance with the present invention.
Figure 4:
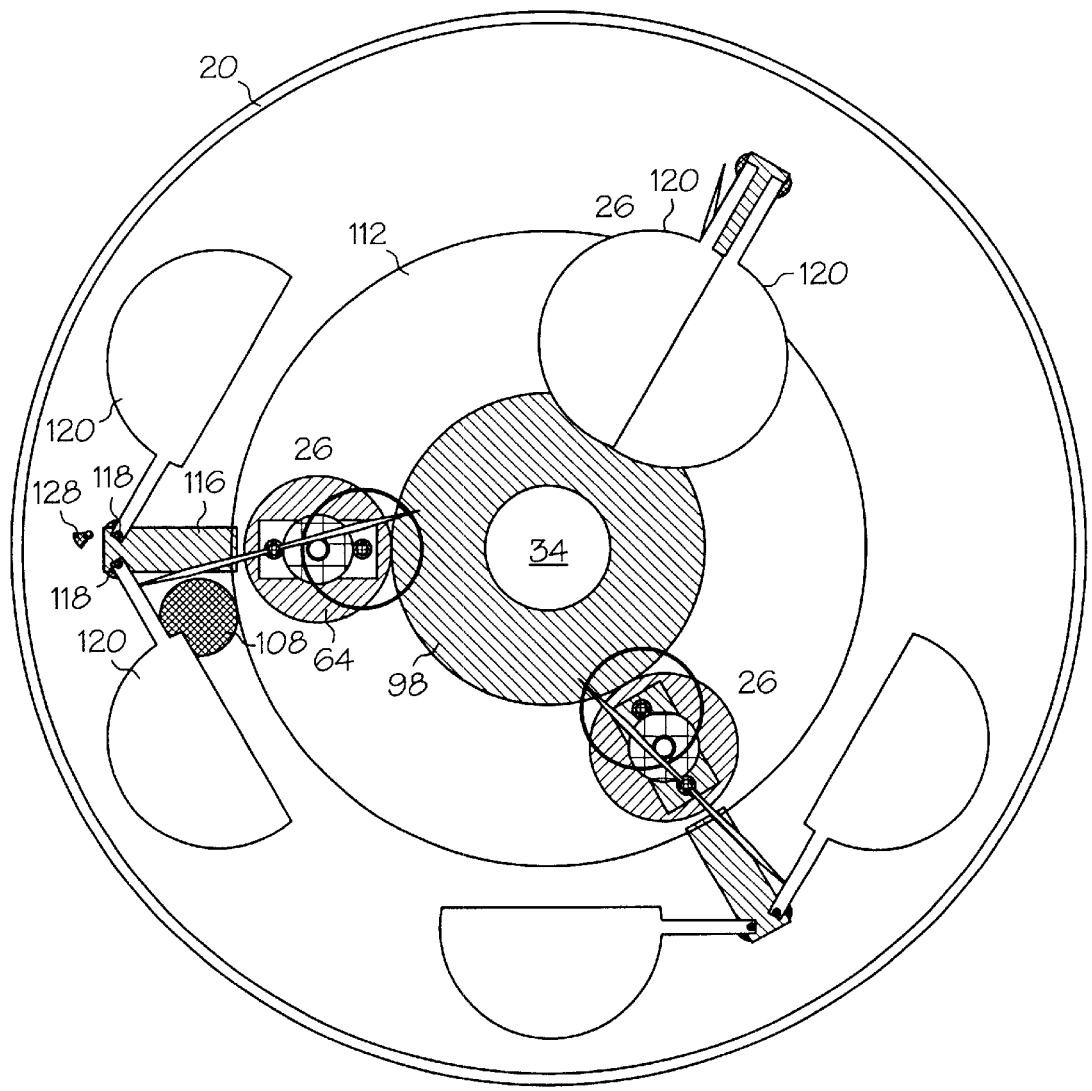
FIG. 4 is a schematic illustration in a bottom view of a super-planetary system having three sub-planetary stations, in accordance with another embodiment of the present invention.

FIGS. 1 to 3 schematically illustrate a first preferred embodiment of the invention which utilizes a single planetary station 26, without disclosing such details which will be readily apparent to those skilled in the art and which would merely clutter the disclosure with unnecessary detail and redundant description. In this connection it should be noted that electromechanical or mechanical parts and assembly of this and other embodiments of the invention comprise bearing and gear assemblies which are per se known in the art and are normally used in the design and assembly of vacuum coating systems and devices. Novel aspects of the present invention lie in the manner the known mechanical or electromechanical parts are arranged, interrelate and cooperate with each other and with the instruments that constitute the invention, as described herein. It is for this reason that a detailed description of the individual components of the gearing and bearing assemblies is not considered necessary.

Referring now to FIGS. 1 to 3 a drive motor 44 is located outside of the vacuum chamber 20, and an output shaft 46 of the drive motor 44 penetrates through the top wall 48 of the vacuum chamber 20 and is mounted therein with suitable state-of-the-art vacuum sealed bearings 50. Generally speaking all important bearings used in the invention are of the self-lubricating ceramic ball-bearing type. A gear, termed planetary drive gear or main drive gear 52 is mounted to the shaft 46 and is rotated thereby. A mounting post 54 is mounted within the interior of the vacuum chamber 20. The mounting post 54 is hollow and its interior serves as an optical path for the wavelength spectrum optical monitoring instrument 36 which is located outside of the vacuum chamber wall 48. In order to allow optical access into the interior of the vacuum chamber 20 a transparent window 56 is sealed to the chamber wall 48 above the hollow mounting post 54.

Another gear, termed the mounting post gear 58 is mounted to the bottom of the mounting post 54. The mounting post gear 58, like the other herein described gears has teeth (not specifically shown) capable of meshing with other gears, but the mounting post gear 58 does not rotate, it is stationarily attached to the mounting post 54. A solid block 60 is rotatably mounted to the mounting post 54 on high quality state-of-the-art bearings 62 suitable for use in vacuum systems. Another gear, termed the planetary gear 64, is fixedly attached to the planetary block 60. The planetary gear 64 is not in direct contact with the mounting post 54, and the planetary block 60 is not in direct contact with the stationary mounting post gear 58. The planetary gear 64 meshes with the planetary drive gear or main drive gear 52 and is driven by it to rotate around the mounting post 54 thereby causing the planetary block 60 to rotate around the mounting post 54.

Two gears are rotatably mounted in positions opposite to one another within the planetary block 60. One of these is the substrate holder gear 66, the axle of which is parallel with the mounting post 54 and is symbolically shown in the drawings as 68. It is rotatably held in the planetary block 60 by state-of the-art bearings 70. The substrate holder gear 66 meshes with the stationary mounting post gear 58. As a result of this arrangement, rotation of the planetary block 60 around the mounting post 54 causes the substrate holder gear 66 to spin around its own axis and also to undergo orbiting planetary motion around the mounting post 54.

The substrate holder axle 68 has the substrate holder 72 fixedly attached to it. The substrate holder 72 in the preferred embodiment is a substantially flat plate or plate-like member which in the presently preferred embodiment comprises clear transparent material (such as quartz or glass) so as to allow optical monitoring of the film deposited on the substrate 30. Alternatively, the substrate holder 72 can comprise non-transparent material (such as metal) in which case it has openings or holes (not shown) allowing optical access to the substrate 30 with the wavelength spectrum optical monitoring instrument 36 through the hollow interior of the mounting post 54. The substrate 30 or substrates 30 (as explained above) are mounted below the plate of the substrate holder 72 with clamps, clips or other instruments well known in the art. The clamps, clips or other instruments utilized to removably hold the substrate 30 in the substrate holder 72 are not shown in the drawing figures.

As noted above, the center or axis of the orbiting planetary motion of the substrate holder gear 66 is the center of the hollow mounting post 54, which also represents the path for the optical observation by the wavelength spectrum optical monitoring instrument 36. The substrate holder 72 and the substrate 30 orbit together with the substrate holder gear 66 so that the center or axis of the mounting post 54 is also the center of the orbiting planetary motion of the substrate 30. It is an important feature of the present invention that the substrate 30 is positioned on the substrate holder 72 in such a manner that in its orbiting motion it is always below the mounting post 54 and always visible to the optical monitoring instrument 36, thereby allowing continuous optical monitoring. In this connection it should be kept in mind that the substrate 30 itself is a transparent body (glass, quartz or others known in the art) so that the film being deposited on the bottom of the substrate 30 can be monitored from the top through the transparent substrate 30 itself. In the event the substrate 30 comprises more than one item (such as several glass plates or lenses) than they are mounted in such a way that each of them cyclically becomes "visible" to the optical instrument 36 as the substrate holder 72 rotates and orbits, thereby allowing continuous optical monitoring of an average thickness of the film being deposited on the several items which jointly comprise the substrate 30.

The second of the two gears mounted in the planetary block 60 is the uniformity mask gear 74, the axle of which is parallel with the mounting post 54 and is symbolically shown in the drawings as 76. It is rotatably held in the planetary block 60 by state-of-the-art bearings 78. The uniformity mask gear 74 meshes with the stationary mounting post gear 58. As a result of this arrangement, rotation of the planetary block 60 around the mounting post 54 causes the uniformity mask gear 74 to spin around its own axis and also to undergo orbiting planetary motion around the mounting post 54. A uniformity mask 38 is mounted to the uniformity mask axle 76 and is carried in spinning and in orbiting planetary motion together with the uniformity mask gear 74. As is shown in the drawings the uniformity mask 38 is of such size that in its complex motion it affects the deposit of vaporized material on the substrate 30. Still further explanation and description of the uniformity mask 38 is not considered necessary because uniformity masks and their role and effects in vacuum deposition systems per se are known in the art.

The first preferred embodiment of the invention also includes a crystal monitoring instrument 34 the function of which has been explained above. Signals transduced by the crystal monitoring instrument 34 are transmitted to the exterior of the vacuum chamber by wires or cables within tubular mounts which are symbolically shown on FIG. 2 as 79.

In the herein described first preferred embodiment the mounting post gear 58 is a gear of 2.75" diameter having 55 teeth, the uniformity mask gear 74 is 0.66" in diameter hand has 18 teeth, while the substrate holder gear 66 is 0.7" in diameter and has 19 teeth. The difference in the number of teeth of the uniformity mask gear 74 and of the substrate holder gear 66 causes a precession of one with respect to the other resulting in improved operation of the uniformity mask 38 and enhanced uniformity of the film(s) deposited on the substrate 30.

The planetary or main drive gear 52 of the first preferred embodiment is of 3.00" in diameter and has 60-teeth. The planetary gear 64 that meshes with the main drive gear 54 is of 2.75" in diameter and has 55 teeth.

The wavelength spectrum optical monitoring instrument 36 is located above the mounting post 54. It is a linear CCD detector based optical spectrometer used to capture a real time spectral picture of light transmitted through the substrate. The Eddy Company Spectralock SL2000 is the preferred instrument to be used presently. A JY Horiba Model 1250 M Spectrometer would be an equivalent choice. The device includes a light source 80 disposed below the substrate 30 and located outside the vacuum chamber 20. The light source 80 is shown in FIG. 3. Light from the light source 80 passes through a transparent window 82, through the substrate 30, either through the transparent substrate holder 72 or through holes (not shown) in the substrate holder 72, then through the center of the hollow mounting post 54, through window 56, and finally into the wavelength spectrum optical monitoring instrument 36. A computer or master controller 84 attached to the wavelength spectrum optical monitoring instrument 36 analyzes the spectrum to determine the proper cut-off point of vapor deposition to attain the desired thickness of the deposited film. As the coating approaches the desired thickness the computer analysis of the spectrum optical monitoring instrument 36 data is used to slow the coating rate allowing for a more accurate cut-off using the source shutter 32.

FIG. 1 is a bottom view of the single planetary system of the first preferred embodiment showing the direction of motion of each of the elements. FIG. 3 is a cross-sectional view of the first preferred embodiment illustrating the location of one vapor source 22 and the light source 80.

Figure 5:
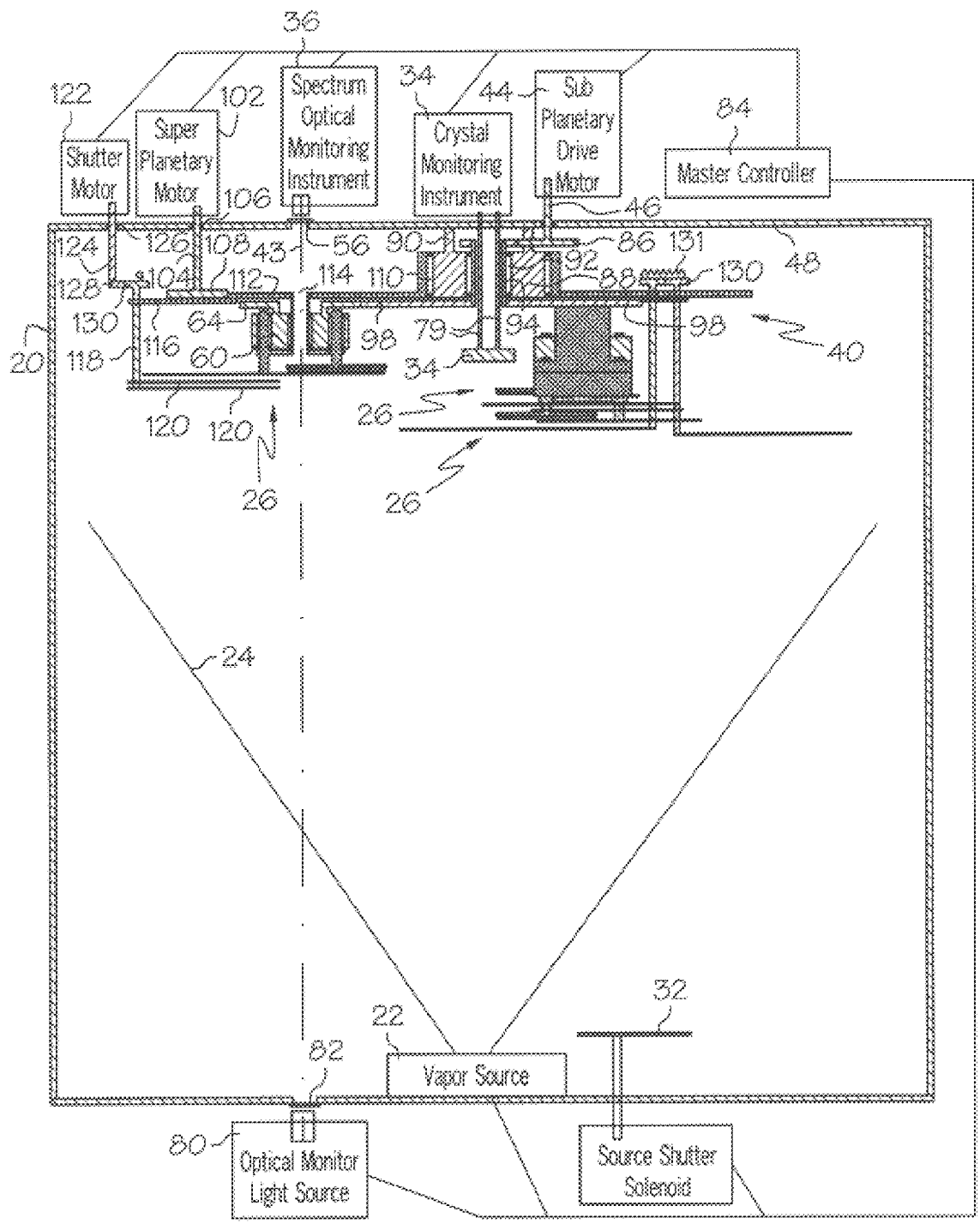
FIG. 5 is a schematic representation in cross-sectional view of a super-planetary system having three sub-planetary stations in a vacuum chamber in accordance with the other embodiment of the present invention.
Figure 6:
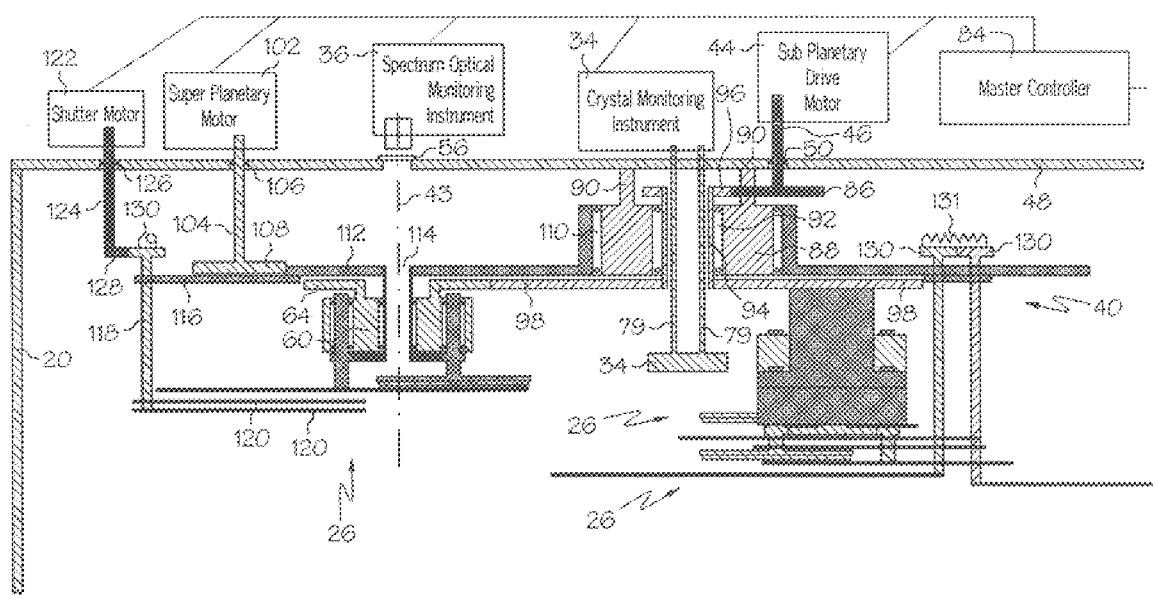
FIG. 6 is an enlarged schematic representation in cross-sectional view of a super-planetary system having three sub-planetary stations in accordance with the other embodiment of the present invention, the enlargement primarily showing the moving components of the system.
Figure 7:
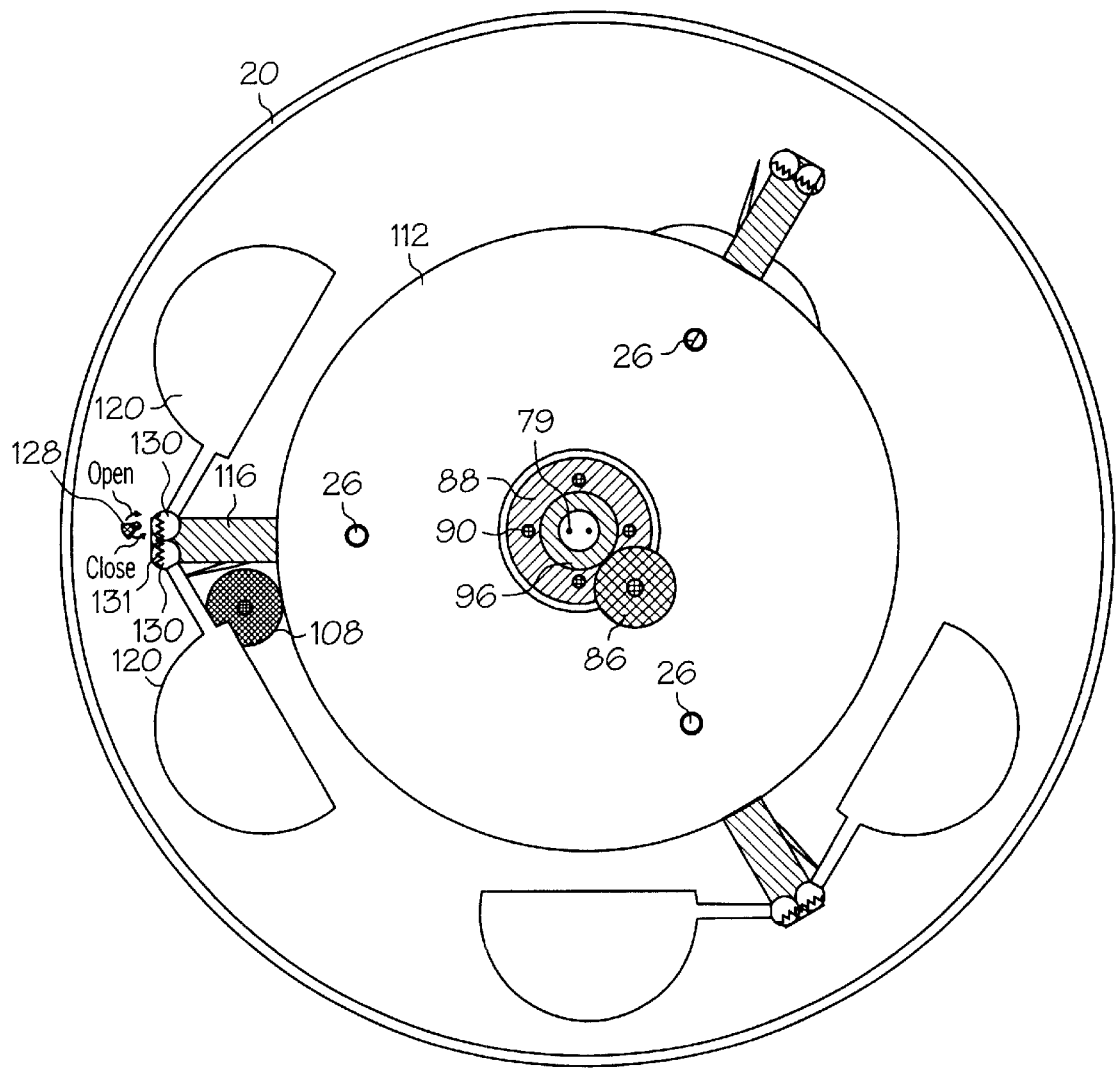
FIG. 7 is schematic representation in a top view of a super-planetary system having three sub-planetary stations, in accordance with the other embodiment of the present invention.

Referring now to FIGS. 4–8 and particularly to the schematic cross-sectional views of FIGS. 5 and 6, the presently preferred embodiment of the more sophisticated version of the invention is disclosed, wherein the superplanetary motion is superimposed over three stations or systems. Each of these three stations undergo planetary motion substantially in the manner described above and are constructed substantially in accordance with the description provided above for the first preferred embodiment. In this more sophisticated second embodiment the three stations or systems are termed sub-planetary stations or sub-planetaries 26. As it is shown in FIG. 5 this second preferred embodiment also comprises a vacuum chamber 20, a source 22 or sources for vapors 24 of the material to be deposited, a solenoid (or the like) activated shutter 32 for preventing vapor deposition from the source 22 (or when applicable from one or more of a plurality of sources each with its own respective shutter), a spectrum optical monitoring system or instrument 36, a light source 80 for the spectrum optical monitoring instrument 36, a crystal monitoring instrument 34, and a computer or master controller 84. Unless described otherwise below, the function of these components is substantially the same as in the hereinbefore described embodiments.

Referring now primarily to the enlarged drawing of FIG. 6, the device includes a drive motor 44 to drive all sub-planetary stations 26. A rotating output shaft 46 of the sub-planetary drive motor 44 penetrates the chamber wall 48 and is mounted in vacuum sealed bearings 50. The shaft 46 carries and rotates a first drive gear 86. A ring shaped body, termed a mounting ring 88, is affixed to the top wall 48 of the vacuum chamber 20 with a plurality of mounting rods 90. In the herein described preferred embodiment four (4) mounting rods 90 are used, but their number is not critical as long as the mounting ring 88 is solidly attached to the top wall 48. A bearing 92 located within the interior of the mounting ring 88 rotatably mounts a tubular shaped body 94 to the mounting ring 88. A second drive gear 96 and a third drive gear 98 are fixedly attached to the tubular shaped body 94. The second drive gear 96 meshes with and is driven by the first drive gear 86, thereby also rotating the third drive gear 98. In the herein described preferred embodiment the dimensions of these gears are as follows: first drive gear 86 is of 2.75" in diameter and has 55 teeth; second drive gear 96 is of 2.75" in diameter and has 55 teeth; and third drive gear 98 is of 10.62" in diameter and has 212 teeth.

Electric cables and mounting tubes (schematically shown as 79) for the crystal monitor instrument 34 are conducted within the interior of the mounting ring 88 to the exterior of the vacuum chamber 20.

A second motor, termed the super-planetary drive motor 102 has a rotating output shaft 104 which is rotatably mounted with vacuum sealed bearings 106 into the chamber wall 48. The output shaft 104 rotates a gear termed the super-planetary drive gear 108. A plate which can also be considered a gear because it has gear teeth on its edge is rotatably mounted by bearings 110 to the exterior of the mounting ring 88. This gear or plate is termed super-planetary plate or gear 112. The super-planetary drive gear 108 is of 2.75" in diameter and has 55 teeth. The super-planetary plate or gear 112 is of 21.5" in diameter and has 430 teeth.

Unlike in the first preferred embodiment where the mounting post 54 of the planetary system 26 is attached to the top chamber wall 48, in this embodiment the hollow mounting posts 54 of all three sub-planetary stations 26 are fixedly suspended from the super-planetary plate or gear 112 below an aperture or opening 114. Another distinction from the construction of the planetary system of the first preferred embodiment is that the planetary blocks 60 of the three stations 26 are spaced approximately one inch from one another in the axial direction. As it was described above in the general description, as a consequence of this spacing the desired thickness of film can be accurately deposited on the substrates 30 of each station 26 in a sequential manner. Otherwise each sub-planetary station 26 is substantially of the same construction as the planetary station 26 of the first preferred embodiment.

Each sub-planetary station 26 includes a planetary gear 64 that meshes with the third drive gear 98 so that each sub-planetary station 26 is simultaneously driven by the rotating third drive gear 98 which is, in turn, is driven by the sub-planetary drive motor 44. The super-planetary plate or gear 112 meshes with the super-planetary drive gear 108 and is therefore rotated by the super-planetary drive motor 102. Thus, when both the sub-planetary drive motor 44 and the super-planetary drive motor 102 are actuated then the substrates 30, substrate holders 72 and uniformity masks 38 of each sub-planetary station 26 undergo spinning and planetary orbiting motion, as in the first preferred embodiment. In addition, due to rotation of the super-planetary plate or gear 112 they also undergo another superimposed orbiting motion, the center of which is the center of the mounting ring 88.

A single vacuum sealed window 56 is located on the top chamber wall 48 to allow "visual access" by the wavelength spectrum optical monitoring instrument 36 to the substrate 30. Referring now back to the general description of the invention, when it is determined through the use of the crystal monitoring instrument 34 that approximately 90 percent of the desired thickness of the film has been attained on a substrate 30 of a sub-planetary station 26 then the master controller 84 causes the super-planetary drive motor 102 to place the appropriate sub-planetary station 26 into the desired pre-set position and to halt the rotation of the super-planetary motor and system. In this pre-determined position the optical axis of the spectrum optical monitoring instrument 36 is in alignment with the opening 114 and with the hollow mounting post 54 of the sub-planetary station 26. FIG. 6 of the drawings shows one sub-planetary station 26 in such position. As described above in the general description, at this stage deposition of the film is continued with only the sub-planetary stations 26 being in motion, and while the thickness of the film on the substrate under observation is continuously monitored until precise completion.

FIGS. 4 through 8 disclose the construction and operation of a shutter system or shutter assembly which allows the discontinuation of film deposit on the substrate 30 of any sub-planetary station after the film deposited on that substrate has attained its precise desired dimension. A shutter arm 116 is fixedly mounted to the super-planetary plate or gear 112 in locations adjacent to each sub-planetary station. Two parallel disposed shutter actuator rods or shafts 118 are rotatably mounted into the shutter arm 116. Only one of these is shown on FIGS. 5 and 6 in the position where they can be actuated (on the left side of FIGS. 5 and 6). However, both rods 118 can be discerned on FIG. 4. One shutter half 120 comprising a plate like member is fixedly attached to each rod 118. In the presently preferred embodiment each shutter half 120 is shaped as semi-circle or half moon, however alternative shapes are possible and within the scope of the invention. The important feature of the shutter halves 120 is that in one rotational position of their respective rod 118 they can stay open, apart from one another thereby exposing the respective substrate 30 to the vapors 24 of the material being deposited as a thin film. Such status of two shutter assemblies is shown, for example in FIG. 4. In another rotational position of their respective rods 118 the two shutter halves 120 close and prevent deposition of the vapors 24 on the respective substrate. One shutter assembly is shown in the closed position in FIG. 4.

A shutter actuating motor 122 is located outside of the vacuum chamber 20, and its output shaft 124 is rotatably mounted with a vacuum sealed bearing 126 into the chamber wall 48. The shutter actuating motor 122 is a small, reversible stepper type motor. The output shaft 124 carries a 60° arc section of a toothed gear, termed a 60° gear 128, which meshes with one of the gears 130 mounted on one of the shutter rods 118. The two gears 130 mesh with each other. Engagement and rotation of the 60° gear 128 in one direction moves the two shutter halves 120 apart from one another thereby opening the shutter assembly. Engagement and rotation of the 60° gear 128 into the other direction moves the two shutter halves 120 together into partially overlapping positions thereby closing the shutter assembly.

The 60° gear 128 is moved by the shutter actuating motor 122 into engagement with the shutter gears 130 when the desired sub-planetary station 26 is aligned with the wavelength spectrum optical monitoring instrument 36. As noted above, this occurs in accordance with the invention when the super-planetary motion is halted for precise completion of vapor deposition on a sub-planetary station 26.

When the super-planetary drive motor 102 is actuated and the super-planetary plate or gear 112 is in continuous rotation then the 60° gear 128 is disengaged from the gears 130 of the shutter assembly, and does not interfere with the super-planetary motions. An over center spring 131 holds shutter halves 120 in either open or closed position until changed, as described above. The shutter actuating motor 122 as all other motors of the device of the invention are controlled by the computer or master controller 84 where the rotational position of each of the components is continuously registered by instrumentation and software known in the art.

What is claimed is:

1. An apparatus for depositing a thin film on a substrate, the apparatus comprising in combination:

a vacuum chamber;

vaporizing means for vaporizing a source material to provide vapors for deposition on the substrate, the vaporizing means being in the interior of the vacuum chamber;

optical monitoring means for measuring the thickness of a thin film which is being deposited on the substrate, the optical monitoring means including a light source, the optical monitoring means being adapted for measuring characteristics of light transmitted through the substrate when the substrate is in the vacuum chamber and thin film is being deposited thereon, the measurement being conducted along an axis of observation that traverses the vacuum chamber;

holding means for holding the substrate within the vacuum chamber while the thin film is deposited on the substrate;

means for imparting orbiting planetary motion and spinning motion to the holding means and thereby to the substrate wherein the center of the orbiting planetary motion of the substrate is within the substrate itself and coincides with the axis of observation of the optical monitoring means, whereby thickness of the film deposited on the substrate can be directly monitored by the optical monitoring means.

2. An apparatus in accordance with claim 1 comprising a plurality of holding means and an equal number imparting means with each holding means being operatively associated with a corresponding imparting means.

3. An apparatus in accordance with claim 1 comprising a uniformity mask and wherein the imparting means are adapted for causing orbiting planetary motion and spinning motion to the uniformity mask.

4. An apparatus in accordance with claim 1 wherein the optical monitoring means comprise a wavelength spectrum optical monitoring instrument.

5. An apparatus in accordance with claim 1 wherein the holding means include a transparent member disposed above the substrate and wherein the optical monitoring means monitors the thickness of the film deposited on the substrate through the transparent member.

6. An apparatus for depositing a thin film on a plurality of substrates, the apparatus comprising in combination:

a vacuum chamber;

vaporizing means for vaporizing a source material to provide vapors for deposition on the substrates, the vaporizing means being in the interior of the vacuum chamber;

optical monitoring means for measuring the thickness of a thin film which is being deposited on the substrates, the optical monitoring means including a light source, the optical monitoring means being adapted for measuring characteristics of light transmitted through the substrate when the substrate is in the vacuum chamber and thin film is being deposited thereon, the measurement being conducted along an axis of observation that traverses the vacuum chamber;

a plurality of holding means each of which is adapted for holding one of the substrates within the vacuum chamber;

a plurality of first means each of which is adapted for imparting orbiting planetary motion and spinning motion to one of the holding means and thereby to the substrate held in the respective holding means;

second means for imparting a superimposed super-planetary motion simultaneously to each of the holding means, the second means also being adapted for halting the super-planetary motion and for placing a selected holding means and the corresponding first means into a position wherein the center of the orbiting planetary motion of the substrate held in the respective holding means is within the substrate itself and coincides with the axis of observation of the optical monitoring means, whereby thickness of the film deposited on the substrate can be directly monitored by the optical monitoring means.

7. An apparatus in accordance with claim 6 further comprising a plurality of uniformity masks, each uniformity mask being operatively associated with one of the holding means and first means and disposed between the vaporizing means and one of the substrates, and wherein each of the first means are also adapted for causing orbiting planetary motion and spinning motion to the respective uniformity mask.

8. An apparatus in accordance with claim 7 wherein each uniformity mask is replaceable.

9. An apparatus in accordance with claim 6 wherein the optical monitoring means comprise a wavelength spectrum optical monitoring instrument.

10. An apparatus in accordance with claim 6 further comprising a plurality of shutter means, each shutter means being operatively associated with one of the holding means and first means and disposed between the vaporizing means and one of the substrates and adapted for optionally being closed to prevent deposition of vapors on the substrate with which it is operatively associated and for optionally being open to allow deposition of vapors on the substrate with which it is operatively associated.

11. An apparatus in accordance with claim 6 wherein the holding means include a transparent member disposed above the substrate and wherein the optical monitoring means monitors the thickness of the film deposited on the substrate through the transparent member.

12. An apparatus in accordance with claim 6 each of the holding means is at a different distance from the vaporizing means whereby the rate of deposition of vapor on each substrate is different.

13. An apparatus for depositing a thin film on a plurality of substrates, the apparatus comprising in combination:

a vacuum chamber;

vaporizing means for vaporizing a source material to provide vapors for deposition on the substrates, the vaporizing means being in the interior of the vacuum chamber;

optical monitoring means for measuring the thickness of a thin film which is being deposited on the substrates, the optical monitoring means including a light source, the optical monitoring means being adapted for measuring characteristics of light transmitted through the substrate when the substrate is in the vacuum chamber and thin film is being deposited thereon, the measurement being conducted along an axis of observation that traverses the vacuum chamber;

a plurality of holding means each of which is adapted for holding one of the substrates within the vacuum chamber, each of the holding means being at a different distance from the vaporizing means whereby the rate of deposition of vapor on each substrate is different;

a plurality of first means each of which is adapted for imparting orbiting planetary motion and spinning motion to one of the holding means and thereby to the substrate held in the respective holding means;

second means for imparting a superimposed super planetary motion simultaneously to each of the holding means, the second means also being adapted for halting the super-planetary motion and for placing a selected holding means and the corresponding first means into a position wherein the center of the orbiting planetary motion of the substrate held in the respective holding means is within the substrate itself and coincides with the axis of observation of the optical monitoring means, whereby thickness of the film deposited on the substrate can be directly monitored by the optical monitoring means;

a plurality of uniformity masks, each uniformity mask being operatively associated with one of the holding means and first means and disposed between the vaporizing means and one of the substrates, and wherein each of the first means are also adapted for causing orbiting planetary motion and spinning motion to the respective uniformity mask, and a plurality of shutter means, each shutter means being operatively associated with one of the holding means and first means and disposed between the vaporizing means and one of the substrates and adapted for optionally being closed to prevent deposition of vapors on the substrate with which it is operatively associated and for optionally being open to allow deposition of vapors on the substrate with which it is operatively associated.

14. An apparatus in accordance with claim 13 wherein the optical monitoring means comprise a wavelength spectrum optical monitoring instrument.

15. An apparatus in accordance with claim 14 wherein the holding means include a transparent member disposed above the substrate and wherein the optical monitoring means monitors the thickness of the film deposited on the substrate through the transparent member.

16. A method of depositing a thin film on a plurality of substrates, the method comprising the steps of:

(1) placing a plurality of substrates in a vacuum chamber equipped with
   (a) vaporizing means for vaporizing a source material to provide vapors for deposition on the substrates,
   (b) with optical monitoring means for measuring the thickness of a thin film which is being deposited on the substrates, the measurement being conducted along an axis of observation that traverses the vacuum chamber, and
   (c) with a plurality of shutter means, each shutter means being operatively associated with one of the substrates and adapted for optionally being closed to prevent deposition of vapors on the substrate with which it is operatively associated and for optionally being open to allow deposition of vapors on the substrate with which it is operatively associated;

(2) simultaneously imparting super-planetary motion and orbiting planetary and spinning motion to each of the substrates while measuring the rate of deposition of vapor at a fixed location in the chamber while vaporizing the source material;

(3) halting the super-planetary motion of the substrates when deposition of vapor deposition at the fixed location has reached a first predetermined limit and imparting orbiting planetary and spinning motion to a first substrate which is in closest proximity to the source material said first substrate being in a position where the center of the orbiting planetary motion of the first substrate is within said first substrate itself and coincides with the axis of observation of the optical monitoring means, whereby thickness of the film deposited on said first substrate can be directly monitored by the optical monitoring means and continuing vaporizing the source material and measuring the thickness of film deposited on said first substrate with the optical monitoring means until the desired thickness of film is deposited on said first substrate;

(4) thereafter closing the shutter means which is operatively associated with said first substrate thereby preventing further deposition of vapor on said first substrate and again simultaneously imparting super-planetary motion and orbiting planetary and spinning motion to each of the substrates while measuring the rate of vapor deposition at a fixed location in the chamber while vaporizing the source material until deposition of vapor at the fixed location has reached a second predetermined limit, and (5) thereafter repeating said steps of (3) and (4) with each substrate in the sequence of their proximity of location to the source material until the desired thickness of film is deposited on each of the substrates.

17. A method in accordance with claim 16 further comprising the step of rotating a uniformity mask in front of each substrate while vapor is being deposited on said substrate.

18. A method in accordance with claim 17 further comprising the steps of evaluating uniformity of thickness of deposited material on each substrate, designing and fabricating a uniformity mask based on said evaluation and utilizing said fabricated uniformity mask in said step of rotating in front of each substrate while vapor is being deposited on said substrate.

19. A method in accordance with claim 16 where the super-planetary motion of each substrate is halted when approximately 90 percent of the desired thickness of film is deposited on each substrate.

20. A method in accordance with claim 16 where the step of measuring the thickness of film with the optical monitoring means comprises measuring wave length spectrum.

* * * * *